(12) United States Patent
Nakagawa (10) Patent No.: US 6,977,202 B2
(45) Date of Patent: Dec. 20, 2005

(54) METHOD OF MAKING A NON-VOLATILE SEMICONDUCTOR MEMORY DEVICE

(75) Inventor: Kenichiro Nakagawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/233,616

(22) Filed: Sep. 4, 2002

(65) Prior Publication Data

US 2003/0042530 A1    Mar. 6, 2003

(30) Foreign Application Priority Data

Sep. 4, 2001   (JP)   ............................. 2001-267393

(51) Int. Cl.$^7$ .......................................... H01L 21/336
(52) U.S. Cl. ..................... 438/266; 257/315; 257/316; 257/317
(58) Field of Search ................ 257/314–318; 438/266, 226, 201, 211, 257, 260

(56) References Cited

U.S. PATENT DOCUMENTS 6,368,907 B1 * 4/2002 Doi et al. .................. 438/217
6,617,632 B2 * 9/2003 Taniguchi et al. .......... 257/296

FOREIGN PATENT DOCUMENTS

JP      7-193198     7/1995

* cited by examiner

Primary Examiner—Hoai Pham
Assistant Examiner—Nathan W. Ha
(74) Attorney, Agent, or Firm—Young & Thompson

(57) ABSTRACT

Disclosed is a fabrication method for a non-volatile semiconductor memory device that comprises a pattern forming step in which by using a first mask layer and a second mask layer formed in a common lithography step as masks, a pattern is formed from a second layer, a third layer, a fourth layer, a sixth layer and a protection layer in a laminated substrate having, in a memory cell area, a sequential lamination of a first layer for forming a first insulating layer, the second layer for forming a floating gate, the third layer for forming an intergate insulating layer, the fourth layer for forming a control gate and a first mask layer, and having, in a logic area, a sequential lamination of a fifth layer for forming a second insulating layer, the sixth layer for forming a logic gate, the protection layer for protecting the sixth layer at the time of forming the control gate and a second mask layer. The fabrication method can fabricate a non-volatile semiconductor memory device by forming layers in a self-aligned manner with respect to a gate electrode while minimizing an alignment error and a chip size.

5 Claims, 8 Drawing Sheets

FIG.1 (PRIOR ART)

MEMORY CELL AREA    LOGIC AREA

FIG.2 (PRIOR ART)

MEMORY CELL AREA    LOGIC AREA

FIG. 3 (PRIOR ART)

MEMORY CELL AREA          LOGIC AREA

FIG. 4 (PRIOR ART)

MEMORY CELL AREA          LOGIC AREA

FIG. 5 (PRIOR ART)

MEMORY CELL AREA         LOGIC AREA

FIG. 6 (PRIOR ART)

MEMORY CELL AREA         LOGIC AREA

MEMORY CELL AREA · LOGIC AREA

FIG. 17

MEMORY CELL AREA · LOGIC AREA

FIG. 18

MEMORY CELL AREA · LOGIC AREA

METHOD OF MAKING A NON-VOLATILE SEMICONDUCTOR MEMORY DEVICE

BACKGROUND OF THE INVENTION

1. Field of the Invention

The present invention relates to a non-volatile semiconductor memory device and a fabrication method therefor. More particularly, the invention relates to a non-volatile semiconductor memory device having a logic circuit and a fabrication method therefor.

2. Description of the Related Art

A conventional fabrication method for a non-volatile semiconductor memory device, such as a flash memory, patterned a control gate in a memory cell area and a logic gate in a logic area using masks formed in separate lithography steps. This fabrication method is referred to as first prior art. In the present specification, a memory cell area includes an area reserved for the formation of memory cells or an area in which the formation of memory cells is under way, and a logic area includes an area reserved for the formation of a logic circuit or an area in which the formation of a logic circuit is under way.

Japanese Patent Laid-Open No. 193198/1995 discloses an improved fabrication method which reduces the number of steps in the fabrication method of the first prior art of forming a memory cell gate and a logic gate by patterning. The fabrication method described in this publication is referred to as second prior art.

Referring now to FIGS. 1 to 6, the fabrication method according to the second prior art will be discussed. FIGS. 1 to 6 are schematic cross-sectional views of the fabrication steps in the fabrication method for a non-volatile semiconductor memory device according to the second prior art and illustrate partial cross sections of the memory cell area and logic area of a non-volatile semiconductor memory device, which is undergoing a fabrication process or has substantially been completed, in the direction of the thickness of its substrate.

Figure 1:
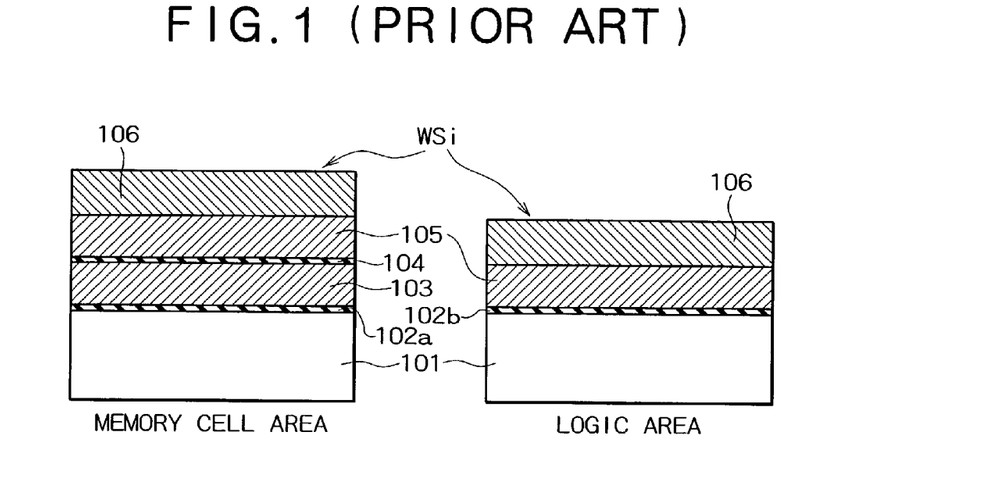
FIG. 1 is a schematic cross-sectional view of a fabrication step in a fabrication method for a non-volatile semiconductor memory device according to the second prior art and shows partial cross sections of the memory cell area and logic area of the non-volatile semiconductor memory device, which is undergoing fabrication, in the direction of the thickness of its substrate.

As shown in FIG. 1, silicon oxide films 102a and 102b are formed on a semiconductor substrate 101, such as p type silicon substrate. A first polysilicon layer 103, an ONO film 104, a second polysilicon layer 105 and a WSi film 106 are deposited on the silicon oxide film 102a in a memory cell area in the named order. Meanwhile, the second polysilicon layer 105 and the WSi film 106 are deposited on the silicon oxide film 102b in a logic area in the named order.

The silicon oxide film 102a is a film for forming the pattern of a tunnel film in the memory cell area. Also, the silicon oxide film 102b is a film for forming the pattern of a gate oxide film in the logic area. The first polysilicon layer 103 is used to form the pattern of a floating gate in the memory cell area. The ONO film is a laminated film with a three-layer structure having an $SiO_2$ film, $Si_3N_4$ film and $SiO_2$ film deposited in the named order. The second polysilicon layer 105 is used to form the pattern of a control gate in the memory cell area and the pattern of a logic gate in the logic area. Each of the first polysilicon layer 103 and the second polysilicon layer 105 may be an amorphous silicon layer.

The following is an example of approximate fabrication steps in the fabrication method of the second prior art until the cross section shown in FIG. 1 is formed. The silicon oxide film 102a is formed on the substrate 101. A polysilicon film is formed on the silicon oxide film 102a in the memory cell area and the logic area. Using a resist mask, the polysilicon film is removed from the logic area by etching and the polysilicon film in the memory cell is patterned to form the first polysilicon layer 103. An ONO film 104 is formed only in the memory cell area and the logic area. The ONO film 104 is left only in the memory cell area by etching and removing the ONO film 104 and the silicon oxide film 102a in the logic area using a resist mask on the memory cell area to expose the surface of the substrate 101 in the logic area. Then, the surface of the semiconductor substrate 101 in the logic area is oxidized to form a silicon oxide film 102b of a gate insulation film. Thereafter, the second polysilicon layer 105 and the WSi film 106 are formed in the memory cell area and the logic area in the named order.

Figure 2:
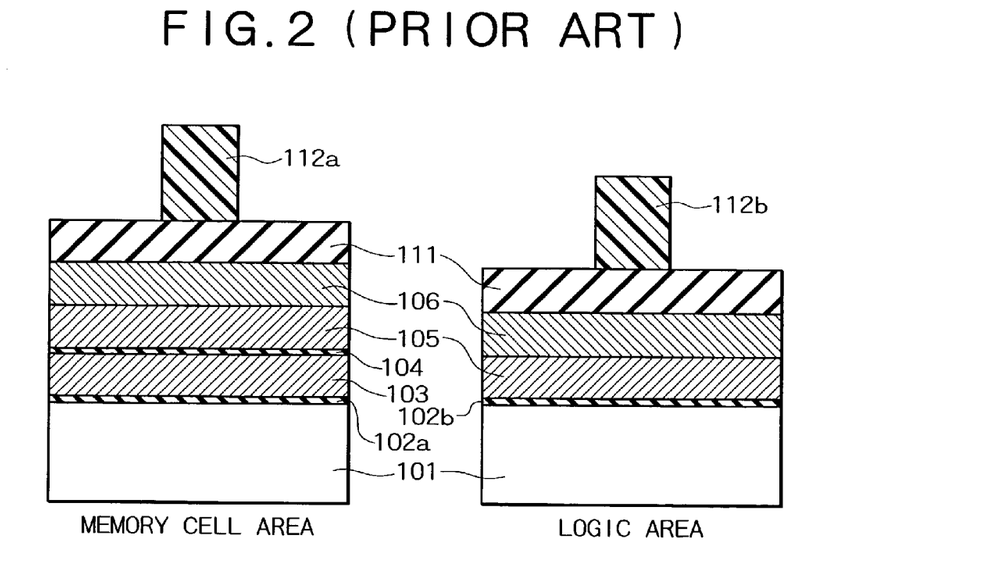
FIG. 2 is a cross-sectional view showing the next step to the one in FIG. 1.

Next, a thick silicon oxide film 111 and a resist film are deposited on the WSi film 106, and the resist film is patterned in both the memory cell area and the logic area to leave resist patterns 112a and 112b on the silicon oxide film 111, as shown in FIG. 2. Next, with the resist patterns 112a and 112b used as masks, the silicon oxide film 111, the WSi film 106 and the second polysilicon layer 105 in the memory cell area and the logic area are etched.

Figure 3:
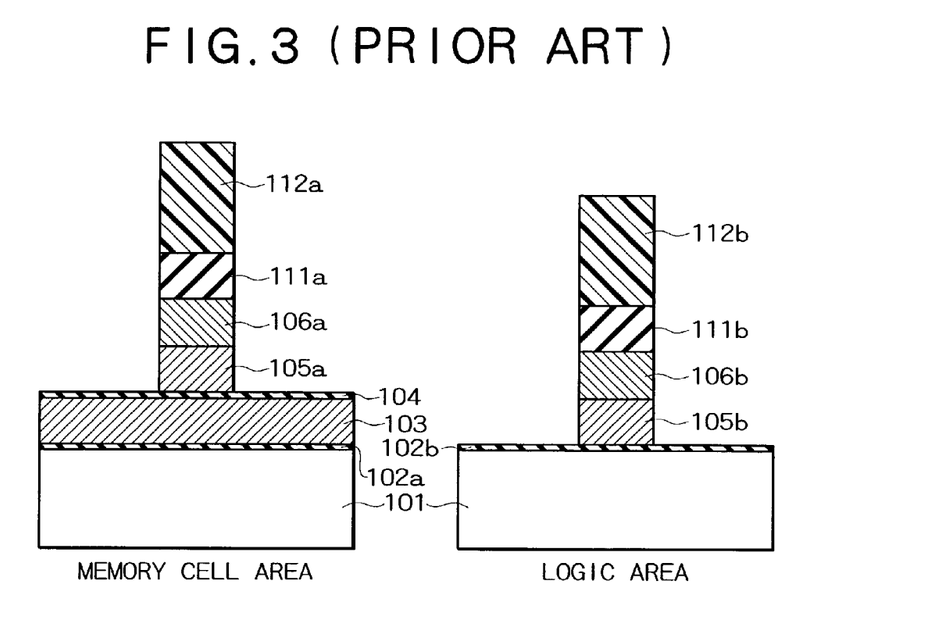
FIG. 3 is a cross-sectional view showing the next step to the one in FIG. 2.
Figure 4:
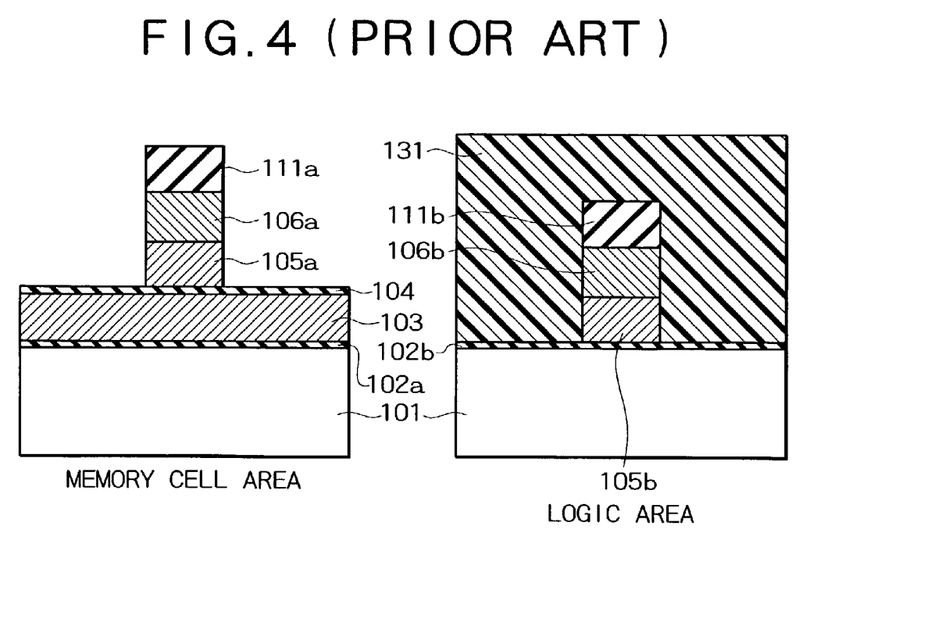
FIG. 4 is a cross-sectional view showing the next step to the one in FIG. 3.

As shown in FIG. 3, a residual portion 105a of the second polysilicon layer, which is equivalent to the control gate, a residual portion 106a of the WSi film and a residual portion 111a of the silicon oxide film 111 are left deposited in the named order from the one closer to the ONO film 104 in the memory cell area after the etching. As shown in FIG. 3, a residual portion 105b of the second polysilicon layer 105, which is equivalent to the logic gate, a residual portion 106b of the WSi film 106 and a residual portion 111b of the silicon oxide film 111, are left laminated in the named order from the one closer to the silicon oxide film 102b, in the logic area after the etching.

Then, the resist patterns 112a and 112b are removed and the entire logic area is covered with a resist pattern 131 which is a new mask. In the state shown in FIG. 4, with the residual portion 111a of the thick silicon oxide film 111, which has already been patterned, used as a mask, the ONO film 104 in the memory cell area and the first polysilicon layer 103 to be a floating gate are etched.

Figure 5:
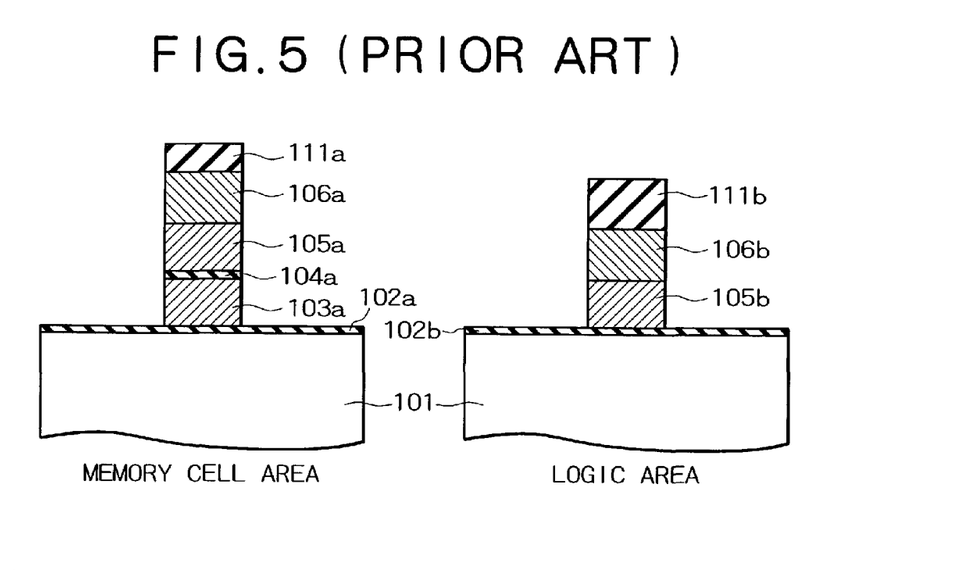
FIG. 5 is a cross-sectional view showing the next step to the one in FIG. 4.

FIG. 5 shows a cross section after the resist pattern 131 is removed after the etching step. Through the etching, a residual portion 103a of the first polysilicon layer 103, which is equivalent to the floating gate, and a residual portion 104a of the ONO film 104, which is equivalent to an intergate insulating layer, are left deposited in the named order from the one closer to the silicon oxide film 102a in the memory cell area after the etching. As shown in FIG. 5, the residual portion 111a of the silicon oxide film 111 used as a mask in the memory cell area is thinner than the one before the etching.

Figure 6:
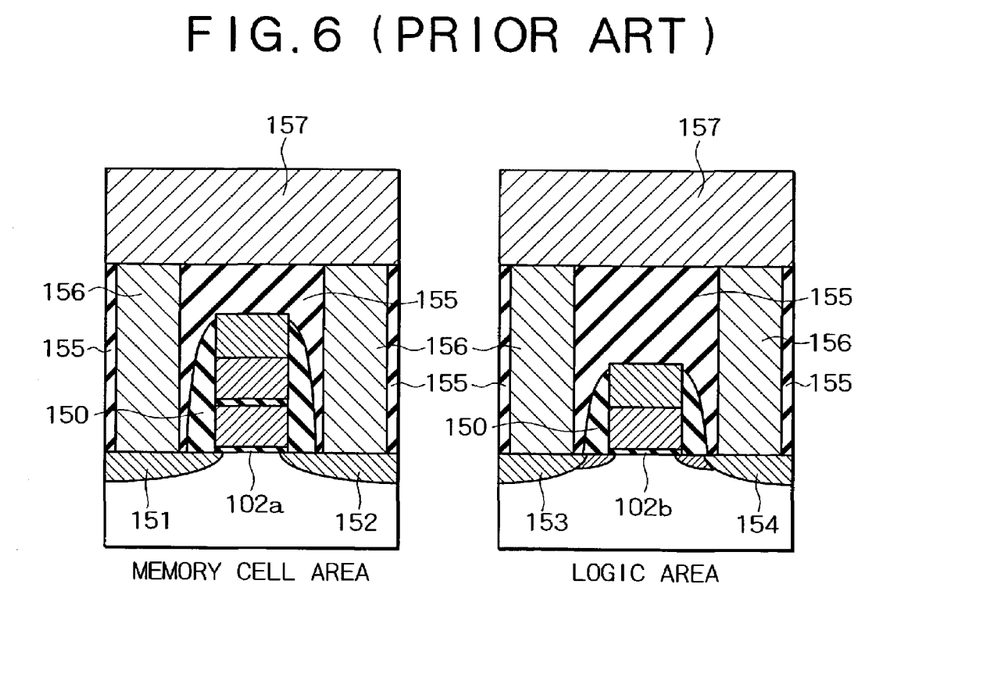
FIG. 6 is a cross-sectional view showing the next step to the one in FIG. 5.

Thereafter, a flash memory as shown in FIG. 6 is formed by using a known method. In FIG. 6, a reference numeral "102a" constitutes a tunnel film, a reference numeral "102b" constitutes a gate oxide film. Also, a reference numeral "150" denotes a silicon oxide film side wall, reference numerals "151" and "153" denote sources, reference numerals "152" and "154" denote drains, a reference numeral "155" denotes a silicon oxide film, a reference numeral "156" denotes a contact and a reference numeral "157" denotes an interconnection.

However, the fabrication method of the first prior art has a shortcoming that the chip size should be increased in consideration of an alignment error. While the fabrication method of the second prior art can fabricate a memory device with a small memory cell size, it cannot silicide a gate once formed by patterning and is not suitable for a salicide process. Here, "salicide" is short for self-aligned silicide.

Figure 7:
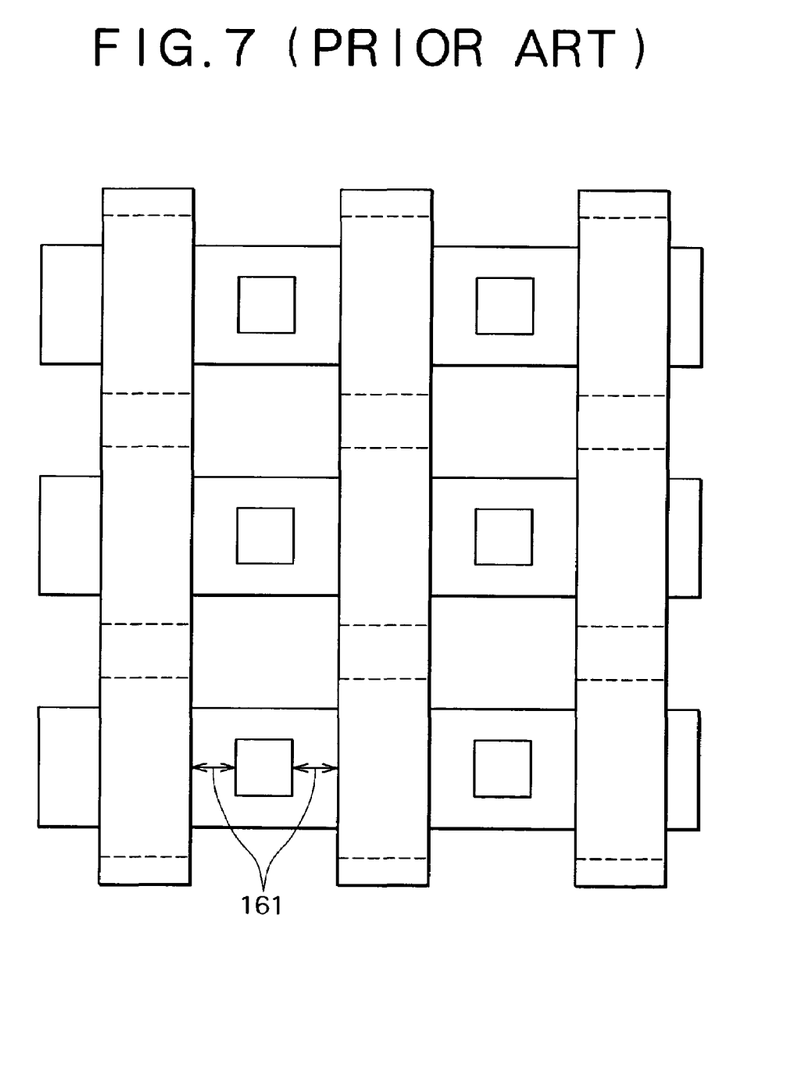
FIG. 7 is a plan view of a part of a flash memory as seen from the direction perpendicular to the substrate.
Figure 8:
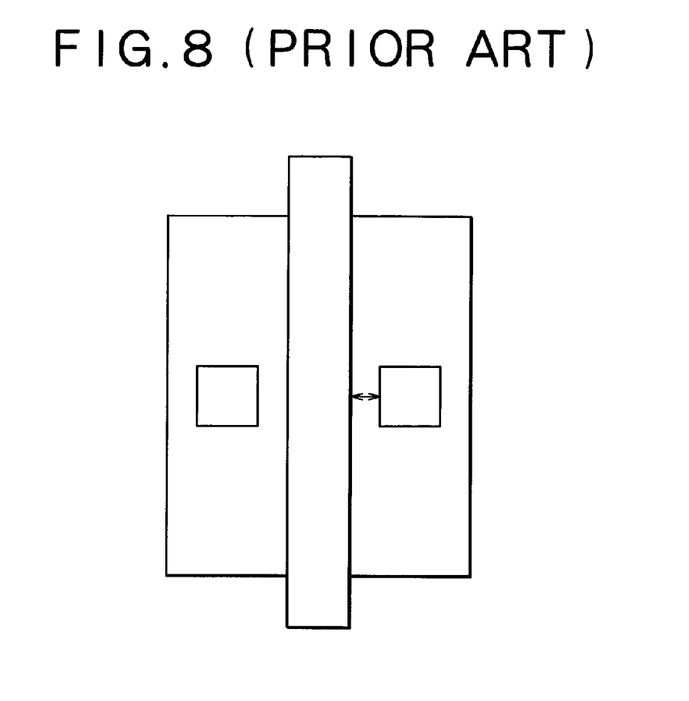
FIG. 8 is a plan view of a logic transistor in a logic area as seen from the direction perpendicular to the substrate.
Figure 9:
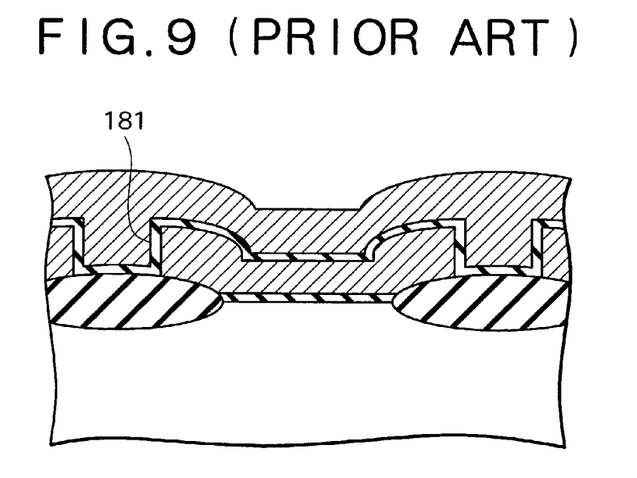
FIG. 9 is a partly cross-sectional view of the memory cell area in the thickness direction of the substrate, including the cross section of an insulating film formed along the side wall of the floating gate in the memory cell area.

Referring to FIGS. 7 to 9, the following will discuss the reasons why the fabrication method of the first prior art and the fabrication method of the second prior art have the aforementioned shortcomings. FIG. 7 is a plan view of a part of a flash memory as seen from the direction perpendicular to the substrate. FIG. 8 is a plan view of a logic transistor in the logic area as seen from the direction perpendicular to the substrate. FIG. 9 is a partly cross-sectional view of the memory cell area in the thickness direction of the substrate, including the cross section of an insulating film formed along the side wall of the floating gate in the memory cell area.

In the fabrication method of the first prior art, the control gate in the memory cell area and the logic gate in the logic area are formed by separate etching steps using separate masks formed in separate lithography steps, so that contact holes to be formed in a subsequent step cannot be aligned with both gates. If the contact hole is aligned with the logic gate, it is necessary to provide a wide margin 161 between each contact and the control gate in FIG. 7. Specifically, as the logic gate and the control gate are aligned with a diffusion layer, a deviation for three lithography steps occurs between the control gate and the contact. Even if the deviation for a single lithography step is suppressed to a range of less than 0.05 μm, a maximum deviation of 0.15 μm may occur. This necessitates that the area should be widened for that deviation, resulting in a larger chip area. The same is applied to the case where contacts are aligned with the control gate.

In a general-purpose flash memory and a flash memory for filing, logic transistors to be mounted serve only to operate memory cells, so that the ratio of the area of the memory cells is large. Even if contacts are aligned with the control gate, using some of the transistor portion, therefore, the chip size does not become so large. Recently, large attention is paid to a logic-on-chip flash memory in which a logic with a sufficient function and a flash memory for storing programs are formed on a single chip. The adverse influence of an increase in the area caused by providing a misalignment margin is crucial to the logic-on-chip flash memory.

There has been some attempts to simultaneously form a control gate and a logic gate using a mask formed in a common lithography step as done in the fabrication method of the second prior art. This method however has the following problem. As shown in FIG. 9 which shows another cross section of a lamination type flash memory, as an insulating film (generally, an ONO film) between the control gate and the floating gate, an insulating film portion 181 is formed perpendicular to the substrate (not shown) on the side of the floating gate.

To sufficiently remove the insulating film portion 181 formed perpendicular to the side of the floating gate, the step of removing the resist mask on the control gate or the resist pattern 112a and then collectively etching the ONO film 104 and the first polysilicon layer 103 in the second prior art needs a sufficient time for etching the ONO film. In case where the insulating film portion formed perpendicular to the side of the floating gate is an ONO film with a thickness of 0.02 μm (200 Å), for example, there needs a time for etching the ONO film to the depth of 0.06 μm (600 Å) in the thickness direction.

Because the residual portion 111a of the silicon oxide film that becomes a mask on the control gate in that etching step has no selectivity with respect to the ONO film, a minimum thickness of 0.06 μm (600 Å) is required. Further, if the residual portion 111a of the silicon oxide film that serves as an etching mask is thin, the upper corners and sides of the control gate are etched. Preventing such etching requires that the silicon oxide film 111 for forming the residual portion 111a of the silicon oxide film that becomes a mask should be formed thick.

For example, the silicon oxide film 111 should have a thickness of 0.15 μm (1500 Å) or greater. The silicon oxide film 111 with a thickness of 0.15 μm (1500 Å) remains in the logic area as the residual portion 111b of the silicon oxide film 111 while keeping the original thickness. To silicide the logic gate, therefore, the residual portion 111b of the silicon oxide film should be etched.

In case of etching out the entire residual portion 111b of the silicon oxide film, however, the oxide film in a device isolation area is also etched to the depth of 0.15 μm (1500 Å). Accordingly, etching of the residual portion 111b of the silicon oxide film cannot be used. This eliminates the possibility of combining a salicide process which is the standard scheme of forming logic transistors with the fabrication method of the second prior art.

SUMMARY OF THE INVENTION

Accordingly, it is an object of the invention to provide a non-volatile semiconductor memory device which can be fabricated with a chip size minimized by minimizing the alignment error and can allow layers to be self-aligned with at least one gate electrode.

It is another object of the invention to provide a novel fabrication method which is different from the conventional fabrication methods and can fabricate a non-volatile semiconductor memory device with a chip size minimized by minimizing the alignment error.

It is a further object of the invention to provide a novel fabrication method which can fabricate a non-volatile semiconductor memory device which with a chip size minimized by minimizing the alignment error and can allow layers to be self-aligned with at least one gate electrode.

A non-volatile semiconductor memory device according to the invention comprises memory cells each having a floating gate, an intergate insulating layer and a control gate sequentially laminated on a semiconductor substrate via a first insulating layer; and a logic circuit having a logic gate formed on the semiconductor substrate via a second insulating layer, the control gate and the logic gate being formed by patterning using a mask formed in a common lithography step, at least one of the control gate and the logic gate having a layer deposited in a self-aligned manner.

A fabrication method for a non-volatile semiconductor memory device according to the invention comprising memory cells each having a floating gate, an intergate insulating layer and a control gate sequentially laminated on a semiconductor substrate via a first insulating layer, and a logic circuit having a logic gate formed on the semiconductor substrate via a second insulating layer, comprises a pattern forming step in which by using a first mask layer and a second mask layer formed in a common lithography step as masks, a pattern is formed from a second layer, a third layer, a fourth layer, a sixth layer and a protection layer in a laminated substrate having, in a memory cell area, a sequential lamination of a first layer for forming a first insulating layer, the second layer for forming the floating gate, the third layer for forming the intergate insulating layer, the fourth layer for forming the control gate and a first mask layer for forming the floating gate and the control gate in the memory cell area, and having, in a logic area, a sequential lamination of a fifth layer for forming a second insulating layer, the sixth layer for forming the logic gate, the protection layer for protecting the sixth layer at the time of forming the control gate and a second mask layer for forming the logic gate.

DETAILED DESCRIPTION OF THE PREFERRED EMBODIMENT

A non-volatile semiconductor memory device according to the invention has a non-volatile memory cell circuit and a logic circuit. The memory cell circuit has a floating gate, an intergate insulating layer and a control gate sequentially laminated on a semiconductor substrate via a first insulating layer. The logic circuit has a logic gate formed on the semiconductor substrate via a second insulating layer.

The control gate and the logic gate are formed by patterning using a mask formed in a common lithography step. At least one of the control gate and the logic gate has a layer deposited in a self-aligned manner.

At least one of each memory cell and the logic circuit can have at least one of a source and a drain having a layer deposited in a self-aligned manner.

The layer deposited in a self-aligned manner can be a layer for reducing a resistance of a target layer to be formed. Available silicides include, for example, $WSi_2$, $MoSi_2$, $TaSi_2$, $TiSi_2$, $CoSi_2$, $NiSi_2$ and $PtSi_2$.

A laminated substrate in a pattern forming step in a fabrication method for a non-volatile semiconductor memory device according to the invention has a first layer for forming a first insulating layer, a second layer for forming a floating gate, a third layer for forming an intergate insulating layer, a fourth layer for forming a control gate and a first mask layer for forming the floating gate and the control gate in a memory cell area, all laminated in order in the memory cell area, and has a fifth layer for forming a second insulating layer, a sixth layer for forming the logic gate, a protection layer for protecting the sixth layer at the time of forming the control gate and a second mask layer for forming the logic gate, all laminated in order in a logic area.

In the pattern forming step, using the first mask layer and the second mask layer formed in a common lithography step as masks, a pattern is formed from the second layer, the third layer, the fourth layer, the sixth layer and the protection layer.

The pattern forming step includes can have a first patterning step, a second patterning step and a third patterning step. The first patterning step forms a pattern by selectively patterning the fourth layer with the first mask layer as a mask. The first patterning step can be a step of forming a pattern by etching the fourth layer under a selectively etchable condition.

The second patterning step forms a pattern, after the first patterning step, by patterning the third layer and the protection layer with the first mask layer and the second mask layer as masks and forming a pattern by patterning the second layer and the sixth layer to a depth deep enough to remove that portion of the third layer which is formed on a side wall of the second layer. The second patterning step can be a step of forming a pattern by etching the third layer, the protection layer, the second layer and the sixth layer under an etchable condition.

The third patterning step forms a pattern, after the second patterning step, by selectively patterning the second layer and the sixth layer, without patterning the first layer and the fifth layer, using the first mask layer and the second mask layer as masks. The third patterning step can be a step of forming a pattern by etching the second layer and the sixth layer under a condition where etching the first layer and the fifth layer is hard and under a selectively etchable condition.

The fabrication method according to the invention can have a protection layer forming step of forming the protection layer before the pattern forming step. The fabrication method according to the invention can have a lithography step of forming the first mask layer and the second mask layer between the protection layer forming step and the pattern forming step. The fabrication method according to the invention can have a residual-pattern-of-protection-layer removing step of removing a pattern formed from a residual of the protection layer from a pattern formed from a residual of the sixth layer after the pattern forming step.

The fabrication method according to the invention can have a step of forming a layer in a self-aligned manner on at least one of a pattern formed from the fourth layer and a pattern formed from the sixth layer after the residual-pattern-of-protection-layer removing step. The fabrication method according to the invention can form a layer for reducing a resistance of a target layer to be formed as the layer formed in a self-aligned manner in the step of forming the self-aligned layer. The fabrication method according to the invention can form a silicide layer as the layer for reducing the resistance of the target layer to be formed.

The material and thickness of the protection layer can be set in such a way that the protection layer is removed in an etching step in at least one of steps between the pattern forming step and the step of forming a layer in a self-aligned manner. A pattern formed from the protection layer which is to be deposited on a pattern formed from the sixth layer can be removed in an etching step for other layers than the protection layer in at least one of steps between the pattern forming step and the step of forming a layer in a self-aligned manner.

One embodiment of the invention will be discussed referring to FIGS. 10 to 18. FIGS. 10 to 18 are schematic cross-sectional views of fabrication steps in a fabrication method for a non-volatile semiconductor memory device according to the embodiment of the invention and show partial cross sections of the memory cell area and logic area of the non-volatile semiconductor memory device, which is undergoing fabrication, in the direction of the thickness of its substrate.

Figure 10:
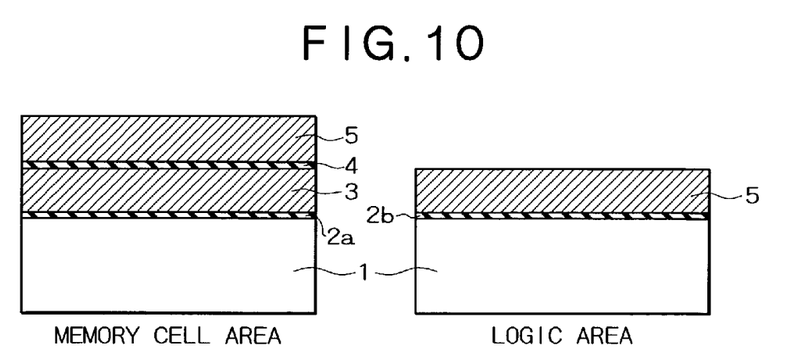
FIG. 10 is a schematic cross-sectional view of a fabrication step in a fabrication method for a non-volatile semiconductor memory device according to one embodiment of the invention and shows partial cross sections of the memory cell area and logic area of the non-volatile semiconductor memory device, which is undergoing fabrication, in the direction of the thickness of its substrate.

As shown in FIG. 10, silicon oxide films 2a and 2b are formed on a semiconductor substrate 1, such as p type silicon substrate. A first polysilicon layer 3, an ONO film 4 and a second polysilicon layer 5 are deposited on the silicon oxide film 2a in a memory cell area in the named order. Meanwhile, the second polysilicon layer 5 is deposited on the silicon oxide film 2b in a logic area.

The silicon oxide film 2a is a film for forming the pattern of a tunnel film in the memory cell area and the silicon oxide film 2b is a film for forming the pattern of a gate oxide film in the logic area. The first polysilicon layer 3 is used to form the pattern of a floating gate in the memory cell area. The ONO film 4 is a laminated film with a three-layer structure having an $SiO_2$ film, $Si_3N_4$ film and $SiO_2$ film deposited in the named order, and is used to form the pattern of an intergate insulating layer. The second polysilicon layer 5 is used to form the pattern of a control gate in the memory cell area and the pattern of a logic gate in the logic area. Each of the first polysilicon layer 3 and the second polysilicon layer 5 may be an amorphous silicon layer.

The fabrication steps up to the formation of the cross section shown in FIG. 10 may be those conventionally known, which will be discussed below. After device isolation areas are formed on a part of the major surface of the substrate 1, the silicon oxide film 2a is formed on a region defined by the isolation areas in a memory cell area and a logic area. A polysilicon film is formed on the silicon oxide film 2a. Using a resist mask, the polysilicon film in the logic area is removed by etching and the polysilicon film in the memory cell area is patterned to form the first polysilicon layer 3. Then, an ONO film 4 is formed in the memory cell area and the logic area. The ONO film 4 is left only in the memory cell area by etching and removing the ONO film 4 and the silicon oxide film 2a in the logic area using a resist mask on the memory cell area to expose the surface of the substrate 1 in the logic area. Then, the surface of the semiconductor substrate 1 in the logic area is oxidized to form a silicon oxide film 2b of a gate insulation film.

Thereafter, the second polysilicon layer 5 is formed in the memory cell area and the logic area.

The resist mask can be formed by applying a liquid substance for forming a resist film on the substrate, drying the liquid substance to form a resist film, then patterning the resist film. The patterning of the resist film can be carried out by, for example, irradiating an exposure pattern, such as ultraviolet rays, onto the resist film to yield a sensitized portion and dissolving either the sensitized portion or a non-sensitized portion into a predetermined solvent to remove it from the substrate and leave the other one on the substrate.

Figure 11:
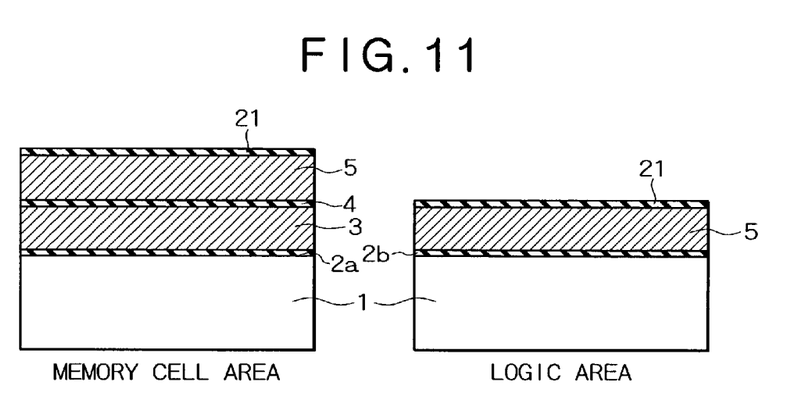
FIG. 11 is a cross-sectional view showing the next step to the one in FIG. 10.
Figure 12:
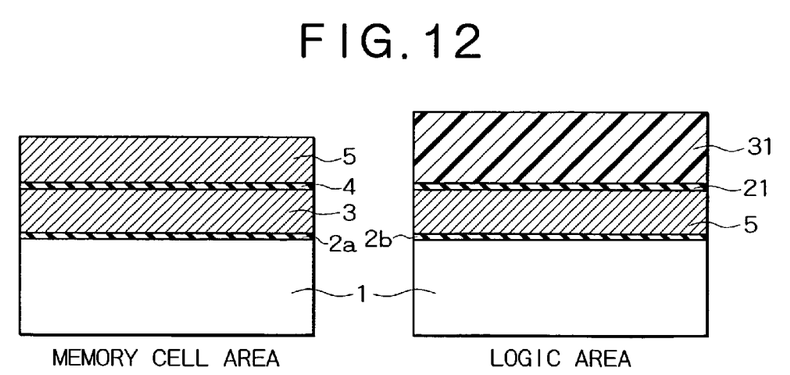
FIG. 12 is a cross-sectional view showing the next step to the one in FIG. 11.

After the second polysilicon layer 5 in FIG. 10 is formed, a silicon oxide film 21 is formed on the second polysilicon layer 5 to a thickness of about 0.05 μm or less (e.g., 0.03 μm, 30 Å), as shown in FIG. 11. Next, a resist film is formed on the silicon oxide film 21 and patterned to remove the resist film in the memory cell area, thus leaving a resist pattern 31 on the silicon oxide film 21 in the logic area. With the resist pattern 31 as a mask, the silicon oxide film in the memory cell area is etched out, thus yielding a cross section shown in FIG. 12.

Figure 13:
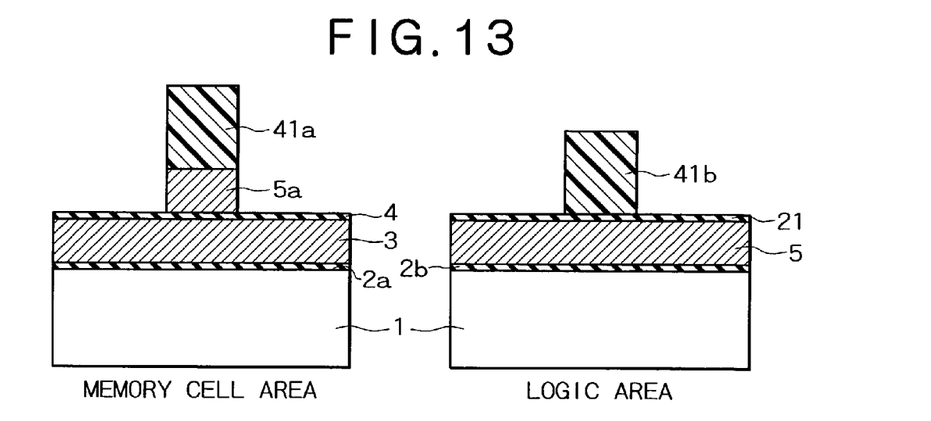
FIG. 13 is a cross-sectional view showing the next step to the one in FIG. 12.

Next, the resist pattern 31 is removed and a new resist film is formed in the memory cell area and logic area. This resist film is simultaneously patterned using the same exposure mask, thus leaving resist patterns 41a and 41b as shown in FIG. 13. Then, with the resist pattern 41a as a mask, the second polysilicon layer 5 is etched to form a pattern of the second polysilicon layer 5. That is, with the resist pattern 41a used as a mask, the second polysilicon layer 5 in the memory cell area is etched using an etching gas of HBr, $Cl_2$ or the like which has a high selectivity to a silicon oxide film and under a high-selectivity etching condition, thus leaving a residual portion 5a of the second polysilicon layer as shown in FIG. 13. At the time etching is performed, as the surface of the logic area is covered with the silicon oxide film 21, the second polysilicon layer 5 formed on the bottom surface of the silicon oxide film 21 is not etched.

Figure 14:
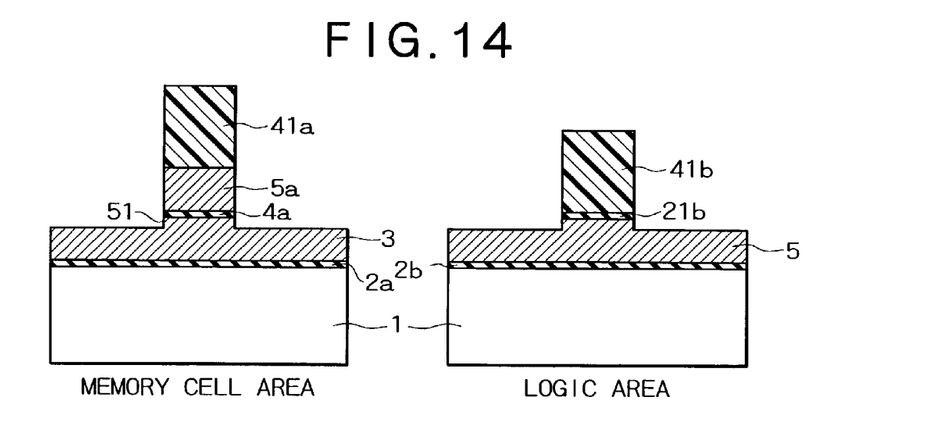
FIG. 14 is a cross-sectional view showing the next step to the one in FIG. 13.

Next, the ONO film 4 in the memory cell area and the silicon oxide film 21 in the logic area are etched using an etching gas of $CF_4$ or the like which has a low selectivity to polysilicon and a silicon oxide film and under a low-selectivity etching condition, thus leaving a residual portion 4a of the ONO film and a residual portion 21b of the silicon oxide film as shown in FIG. 14, followed by etching of the first polysilicon layer 3 under the ONO film 4 and the second polysilicon layer 5 under the silicon oxide film 21 each to the depth of about 0.05 to 0.1 μm (500 to 1000 Å). The ONO film is an Oxide-NitrideOxide film, which is a laminated film with a threelayer structure having an $SiO_2$ film, $Si_3N_4$ film and $SiO_2$ film deposited in the named order.

The reason for carrying out the aforementioned etching using an etching gas and etching condition which have no selectivity or a low selectivity to polysilicon and a silicon oxide film is that to prevent staying of a part of the first polysilicon layer 3 which should have been removed but would get behind the ONO film formed on the side wall of the first polysilicon layer 3, parts of the ONO film 4 and the first polysilicon layer 3 should be etched together in such a way that the thickness of a residual portion 51 remaining after the etching of the first polysilicon layer 3, i.e., the thickness of the first polysilicon layer 3 becomes approximately 0.05 to 0.1 μm (500 to 1000 Å). As a result, the difference between the thicknesses of the ONO film 4 and the silicon oxide film 21 in the logic area, which is about 0.01 to 0.04 μm (100 to 400 Å), can be neglected.

Figure 15:
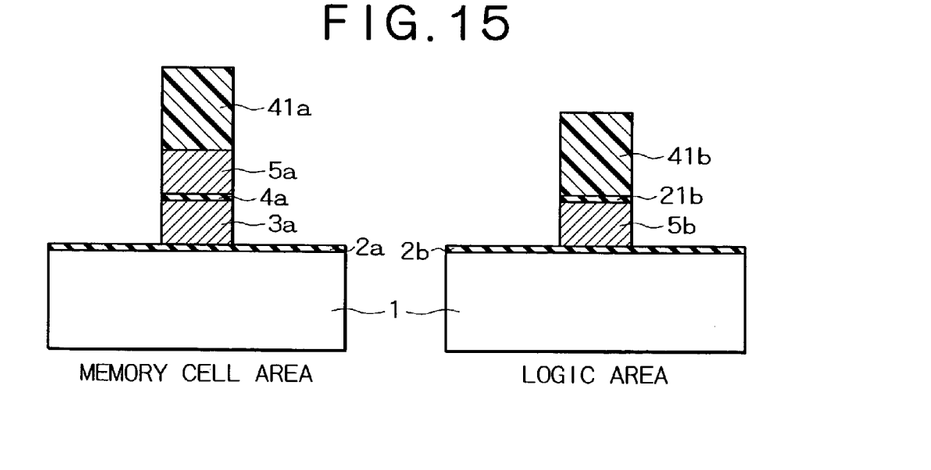
FIG. 15 is a cross-sectional view showing the next step to the one in FIG. 14.

Then, as shown in FIG. 15, the first polysilicon layer in the memory cell area and the second polysilicon layer 5 in the logic area are etched simultaneously using an etching gas, such as HBr or $Cl_2$, again, leaving a residual portion 3a of the first polysilicon layer 3 on the silicon oxide film 2a in the memory cell area and leaving a residual portion 5b of the second polysilicon layer 5 on the silicon oxide film 2b in the logic area.

Figure 16:
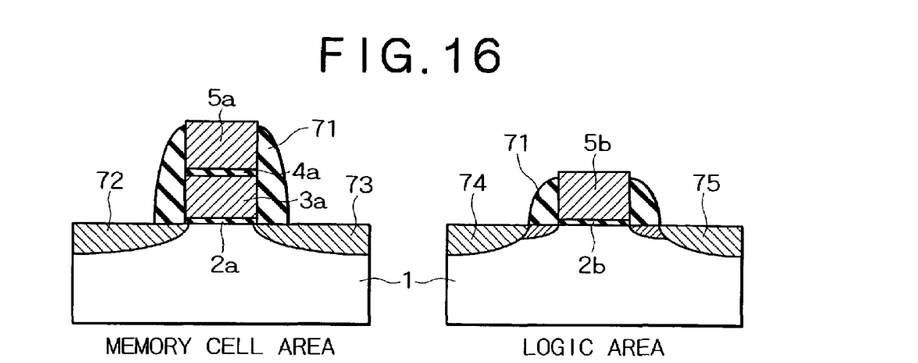
FIG. 16 is a cross-sectional view showing the next step to the one in FIG. 15.

Thereafter, oxidization is performed to prevent leakage from the sides of the floating gate, forming an oxide film, such as a silicon oxide film, with a thickness of about 0.01 m (about 100 Å), and then ion injection is carried out to form memory cells and the sources and drains of transistors. Then, to make the diffusion layer of the logic section have an LDD (Lightly Doped Drain) structure, the oxide film is subjected to anisotropic etching, thus forming an oxide film side wall 71, as shown in FIG. 16. At the time of etching back the oxide film that will become the side wall 71, a residual portion 21b of the silicon oxide film 21 on the logic gate should be removed completely.

Figure 17:
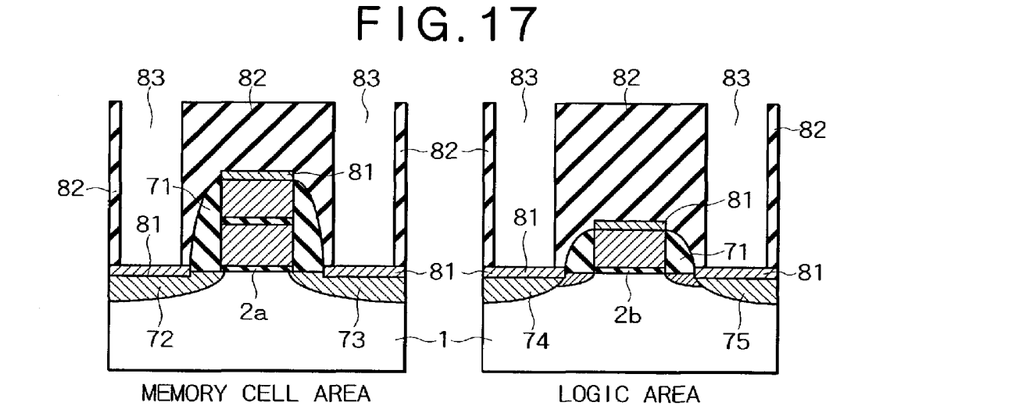
FIG. 17 is a cross-sectional view showing the next step to the one in FIG. 16.

Next, as shown in FIG. 17, to reduce the resistances of the gate and diffusion layer, silicon is reacted with Ti, Co or the like, thereby depositing a metal silicide layer 81 on the surfaces of the residual portions 5a and 5b of the second polysilicon layer 5, sources 72 and 74 and drains 73 and 75. Thereafter, a silicon oxide film or the like 82 is formed in the memory cell area and the logic area to bury the metal silicide layer 81 and the underlying layers, thereby planarizing the surface of the silicon oxide film or the like by CMP (Chemical Mechanical Polishing). Then, contact holes 83 are formed by etching using a resist mask. Thereafter, contacts 91 and interconnections 92 are formed of a conductive material, such as aluminum or tungsten, through known fabrication steps, thereby forming memory cells and a logic as shown in FIG. 18.

In the formation of the contact holes in FIG. 17 in this embodiment, alignment of the contact holes in the vicinity of the control gate in the memory cell area and alignment of the contact holes in the vicinity of the logic gate in the logic area can be executed at the same time. This can reduce a misalignment margin between the contact holes and the control gate (or the logic gate) which should have been set sufficiently wide conventionally.

Figure 18:
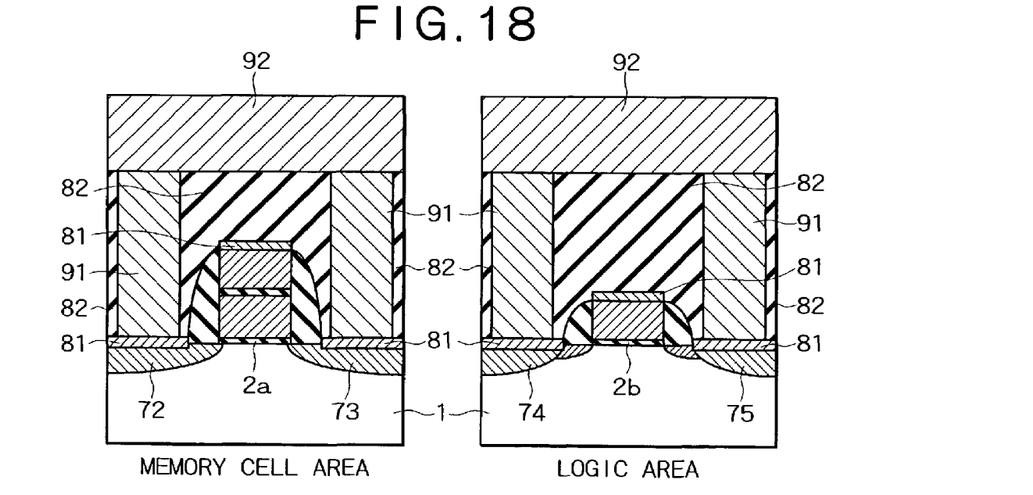
FIG. 18 is a cross-sectional view showing the next step to the one in FIG. 17.

Referring to FIG. 18, the operation of the flash memory that is fabricated by the fabrication method therefor according to one embodiment of the invention will be discussed below. While there are plural write/erase systems for a flash memory, the following description is given on the case where writing is accomplished by injection of channel hot electrons and erasing is accomplished by an FN tunnel current.

At the time of writing, a positive voltage (e.g., 5 V) is applied to the drain 73, and a positive voltage (e.g., 9 V) is applied to the control gate 5a, while the source 72 and the substrate 1 are set to 0 V. At this time, as the electrons (hot electrons) that have a high energy due to an electric field near the drain 73 of the channel are injected into the floating gate 3a, the threshold value of the memory cell increases to a written state.

At the time of erasure, a negative voltage (e.g., –8 V) is applied to the control gate 5a, and a positive voltage (e.g., 7 V) is applied to the substrate 1. The electric field that has been generated at this time produces an FN tunnel current in a tunnel film 2a, drawing electrons to the substrate 1 from the floating gate 3a. As a result, the threshold value of the memory cell decreases to an erased state.

At the time of actual erasing, a scheme of gradually increasing the voltage in plural stages to draw the electrons may be used to avoid the rising of the voltage applied to the tunnel film 2a at the initial stage of erasure.

At the time of reading a memory cell, a positive voltage (e.g., 1 V) is applied to the drain 73, and a positive voltage (e.g., 4 V) is applied to the control gate 5a, while the source 72 and the substrate 1 are set to 0 V. When the memory cell is in a written state, no current flows between the drain and source, whereas the current flows therebetween when the memory cell is in an erase state. It is therefore determined based on the current flowing in the memory cell whether the memory cell is in a written state or erased state.

The fabrication method according to the embodiment of the invention can permit the use of a salicide process and fabricate a logic-on-chip flash memory by reducing the misalignment margin between the contact hole and the cell gate or between the contact hole and the logic gate while lowering the resistance of the gate, thus reducing the chip size.

The reason for the above advantage will be discussed more specifically. In the embodiment of the invention, as lithography of the cell gate and lithography of the logic gate are carried out simultaneously, the cell gate and the logic gate can be aligned simultaneously in the lithography of the contact hole. Further, the thickness of the silicon oxide film to be formed on the gates can be set as thin as about 0.05 $\mu$m or less (500 Å or less), so that the silicon oxide film remaining on the logic gate can be removed in an etching step in at least one of the steps involved up to the silicide forming step, including the step of forming the oxide film side wall and the step of removing the oxide film which is formed at the time of injecting electrons in the source and drain of the logic transistor. The invention can therefore allow a salicide process to be employed without adding a special step.

The non-volatile semiconductor memory device according to the invention has such an advantage that the memory device can be fabricated with a chip size minimized by minimizing the alignment error and layers can be self-aligned with at least one gate electrode. The advantage is provided because the non-volatile semiconductor memory device according to the invention comprises memory cells each having a floating gate, an intergate insulating layer and a control gate sequentially laminated on a semiconductor substrate via a first insulating layer, and a logic circuit having a logic gate formed on the semiconductor substrate via a second insulating layer, the control gate and the logic gate are formed by patterning using a mask formed in a common lithography step, and at least one of the control gate and the logic gate has a layer deposited in a self-aligned manner.

The fabrication method for a non-volatile semiconductor memory device according to the invention has such an advantage that the memory device can be fabricated with a chip size minimized by minimizing the alignment error and layers can be self-aligned with at least one gate electrode. The advantage is provided because the fabrication method for a non-volatile semiconductor memory device according to the invention comprising memory cells each having a floating gate, an intergate insulating layer and a control gate sequentially laminated on a semiconductor substrate via a first insulating layer, and a logic circuit having a logic gate formed on the semiconductor substrate via a second insulating layer, comprises a pattern forming step in which by using a first mask layer and a second mask layer formed in a common lithography step as masks, a pattern is formed from a second layer, a third layer, a fourth layer, a sixth layer and a protection layer in a laminated substrate having, in a memory cell area, a sequential lamination of a first layer for forming a first insulating layer, the second layer for forming the floating gate, the third layer for forming the intergate insulating layer, the fourth layer for forming the control gate and a first mask layer for forming the floating gate and the control gate in the memory cell area, and having, in a logic area, a sequential lamination of a fifth layer for forming a second insulating layer, the sixth layer for forming the logic gate, the protection layer for protecting the sixth layer at the time of forming the control gate and a second mask layer for forming the logic gate.

What is claimed is:

1. A method of making a semiconductor memory device that has a substrate, memory cells on the substrate that each has a floating gate, a control gate, a first insulating layer between the substrate and the floating gate and an intergate insulating layer between the floating and control gates, and a logic circuit with a logic gate separated from the substrate by a second insulating layer, the method comprising the steps of:

for the memory cells, sequentially laminating on the substrate a first layer that will form the first insulating layer, a second layer that will form the floating gate, a third layer that will form the intergate insulating layer, and a fourth layer that will form the control gate, to form a memory cell lamination;

for the logic circuit, sequentially laminating on the substrate a fifth layer that will form the second insulating layer, a sixth layer that will form the logic gate, and a protection layer, to form a logic circuit lamination;

in one lithography step, applying a mask layer to the fourth layer of the memory cell lamination and to the protection layer of the logic circuit lamination; and first patterning the fourth layer of the memory cell lamination using the mask layer and protecting the sixth layer of the logic circuit lamination with the protection layer during patterning of the fourth layer; and second patterning the second and third layers of the memory cell lamination and the protection layer and the sixth layer of the logic circuit lamination using the mask layer.

2. The method of claim 1, wherein the first and fifth layers are formed from one lamination of an insulative material.

3. The method of claim 1, wherein the fourth and sixth layers are formed from one lamination of polysilicon.

4. A method of making a semiconductor memory device that has a substrate, memory cells on the substrate that each has a floating gate, a control gate, a first insulating layer between the substrate and the floating gate and an intergate insulating layer between the floating and control gates, and a logic circuit with a logic gate separated from the substrate by a second insulating layer, the method comprising the steps of:

for the memory cells, sequentially laminating on the substrate a first layer that will form the first insulating layer, a second layer that will form the floating gate, a third layer that will form the intergate insulating layer, and a fourth layer that will form the control gate, to form a memory cell lamination;

for the logic circuit, sequentially laminating on the substrate a fifth layer that will form the second insulating layer, a sixth layer that will form the logic gate, and a protection layer, to form a logic circuit lamination;

in one lithography step, applying a mask layer to the fourth layer of the memory cell lamination and to the protection layer of the logic circuit lamination; and first patterning the fourth layer of the memory cell lamination using the mask layer and protecting the sixth layer of the logic circuit lamination with the protection layer during patterning of the fourth layer; and second patterning the second and third layers of the memory cell lamination and the protection layer and the sixth layer of the logic circuit lamination using the mask layer, wherein the second patterning step comprises the steps of patterning the third layer and less than all of a thickness of the second layer and patterning the protection layer and less than all a thickness of the sixth layer with a first etchant, and patterning a remaining thickness of said second and sixth layers with a second etchant that is different from the first etchant.

5. The method of claim 4, wherein the first patterning step is carried out with etchants.

* * * * *